United States Patent
Tsunomura et al.

(10) Patent No.: US 9,705,022 B2
(45) Date of Patent: *Jul. 11, 2017

(54) PHOTOVOLTAIC DEVICE

(71) Applicant: SANYO Electric Co., Ltd., Osaka (JP)

(72) Inventors: Yasufumi Tsunomura, Osaka (JP); Akiyoshi Ogane, Osaka (JP); Toshiaki Baba, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 31 days.

This patent is subject to a terminal disclaimer.

(21) Appl. No.: 14/470,114

(22) Filed: Aug. 27, 2014

(65) Prior Publication Data

US 2014/0360577 A1 Dec. 11, 2014

Related U.S. Application Data

(63) Continuation of application No. PCT/JP2012/055368, filed on Mar. 2, 2012.

(51) Int. Cl.
*H01L 31/0747* (2012.01)
*H01L 31/20* (2006.01)
*H01L 31/0288* (2006.01)

(52) U.S. Cl.
CPC ...... *H01L 31/0747* (2013.01); *H01L 31/0288* (2013.01); *H01L 31/202* (2013.01); *Y02E 10/50* (2013.01); *Y02P 70/521* (2015.11)

(58) Field of Classification Search
CPC .... H01L 31/0747; H01L 31/20; H01L 31/202
See application file for complete search history.

(56) References Cited

U.S. PATENT DOCUMENTS

| 4,581,476 A * | 4/1986 | Yamazaki | H01L 31/028 136/255 |
| 2001/0008295 A1 | 7/2001 | Sakata et al. | |
| 2003/0168578 A1 * | 9/2003 | Taguchi | H01L 31/0747 250/214.1 |
| 2003/0168660 A1 | 9/2003 | Terakawa et al. | |

(Continued)

FOREIGN PATENT DOCUMENTS

| JP | H06291342 A | 10/1994 |
| JP | H11112011 A | 4/1999 |

(Continued)

OTHER PUBLICATIONS

International Search Report for Application No. PCT/JP2012/055368; date of mailing, May 1, 2012; with English Translation.

*Primary Examiner* — Allison Bourke
*Assistant Examiner* — William E McClain
(74) *Attorney, Agent, or Firm* — Cantor Colburn LLP

(57) ABSTRACT

This photovoltaic device is provided with a crystalline semiconductor substrate, and a first amorphous layer formed on the main surface of the substrate. At the interface between the substrate and the first amorphous layer, electrical conductivity can be improved while suppressing an increase in recombination centers, and power generation efficiency can be improved by having a p-type dopant density profile that decreases stepwise in the film thickness direction from the vicinity of the interface with the substrate.

7 Claims, 3 Drawing Sheets

(56) References Cited

U.S. PATENT DOCUMENTS

| | | | |
|---|---|---|---|
| 2008/0230121 A1* | 9/2008 | Terakawa | H01L 31/0352 136/261 |
| 2008/0230782 A1* | 9/2008 | Antoniadis | H01L 31/0352 257/53 |
| 2014/0102527 A1* | 4/2014 | Ogane | H01L 31/0747 136/255 |
| 2014/0102528 A1* | 4/2014 | Yano | H01L 31/0747 136/255 |

FOREIGN PATENT DOCUMENTS

| | | |
|---|---|---|
| JP | 2001-189478 A | 7/2001 |
| JP | 2001345463 A | 12/2001 |
| JP | 2003258287 A | 9/2003 |
| JP | 2004296776 A | 10/2004 |

* cited by examiner

PHOTOVOLTAIC DEVICE

CROSS REFERENCE TO RELATED APPLICATION

The present application is a continuation under 35 U.S.C. §120 of PCT/JP2012/055368, filed on Mar. 2, 2012, which is incorporated herein by reference.

TECHNICAL FIELD

The present invention relates to a photovoltaic device.

BACKGROUND ART

Photovoltaic devices are known in which an amorphous silicon layer which is substantially intrinsic is formed between a crystalline silicon substrate and a doped amorphous silicon layer.

As means for improving output characteristics of the photovoltaic device having such a structure, a structure has been disclosed in which oxygen is introduced into an interface portion between the silicon substrate and the intrinsic amorphous silicon layer (refer to Patent document 1).

A structure has been disclosed in which an i-type amorphous silicon thin film is provided between a crystalline silicon substrate and a p-type amorphous silicon, and boron (B) are introduced into an interface between the crystalline silicon substrate and the i-type amorphous silicon thin film (refer to Patent document 2).

These structures have been known to improve interface characteristics of the crystalline silicon substrate and the amorphous silicon to thereby suppress recombination of carriers at the interface.

CITATION LIST

Patent Literature

Patent document 1: Japanese Patent Laid-Open Publication No. 2003-258287
Patent document 2: Japanese Patent Laid-Open Publication No. 2001-345463

SUMMARY OF INVENTION

Technical Problem

As described above, in a photovoltaic device having the amorphous silicon layer provided on the crystalline silicon substrate, it is important to further reduce a recombination center at the interface between the crystalline silicon substrate and the amorphous silicon layer and to suppress, to the extent possible, disappearance of the carrier owing to the recombination at the interface. Reduction of a series resistance component in the vicinity of the interface is also required to be achieved at the same time.

Solution to Problem

The present invention provides a photovoltaic device which includes a crystalline semiconductor substrate and an amorphous semiconductor layer formed on a main surface of the substrate, and has a p-type dopant density profile at an interface between the substrate and the amorphous semiconductor layer, the profile decreasing stepwise in a film thickness direction from the vicinity of the interface with the substrate.

Advantageous Effect of Invention

According to the present invention, photoelectric conversion efficiency can be improved in the photovoltaic device.

DESCRIPTION OF EMBODIMENTS

Figure 1:
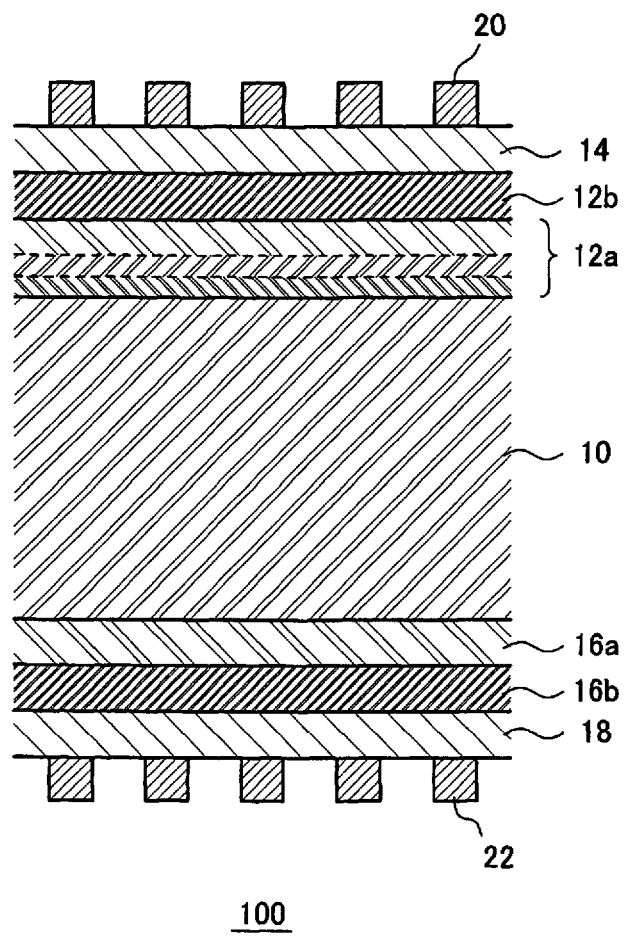
FIG. 1 is a cross sectional plan view of a photovoltaic device in an embodiment according to the present invention.

As shown in FIG. 1, a photovoltaic device 100 according to an embodiment of the present invention includes a substrate 10, a first amorphous layer 12a, a second amorphous layer 12b, a transparent conductive layer 14, a third amorphous layer 16a, a fourth amorphous layer 16b, a transparent conductive layer 18, a first electrode 20, and a second electrode 22.

Hereinafter, a description is given of a structure of the photovoltaic device 100 while showing a method for manufacturing the photovoltaic device 100.

Table 1 shows exemplary formation conditions of amorphous layers in the photovoltaic device 100. The various film formation conditions used in the embodiment are merely exemplary and may be suitably changed and optimized according to the device to be used. As shown in Table 1, diborane ($B_2H_6$) and phosphine ($PH_3$) are diluted by hydrogen.

TABLE 1

| Process | | Substrate temperature (° C.) | Gaseous species/Gas flow rate | Pressure (Pa) | Power density (mW/cm$^2$) |
|---|---|---|---|---|---|
| Front surface | Surface treatment | 150-250 | $H_2$: 100-300 sccm<br>$B_2H_6/H_2$: 0-10 sccm<br>$CO_2$: 0-50 sccm | 10-100 | 1-10 |
| | First amorphous layer 12a | 150-250 | $H_2$: 0-300 sccm<br>$SiH_4$: 10-50 sccm<br>$B_2H_6/H_2$: 0-10 sccm<br>$CO_2$: 0-50 sccm | 10-100 | 1-10 |
| | Second amorphous layer 12b | 150-250 | $H_2$: 0-300 sccm<br>$SiH_4$: 10-50 sccm<br>$B_2H_6/H_2$: 10-50 sccm | 10-100 | 1-10 |

TABLE 1-continued

| | Process | Substrate temperature (° C.) | Gaseous species/Gas flow rate | Pressure (Pa) | Power density (mW/cm$^2$) |
|---|---|---|---|---|---|
| Back surface | Surface treatment | 150-250 | H$_2$: 100-300 sccm | 10-100 | 1-10 |
| | Third amorphous layer 16a | 150-250 | H$_2$: 0-300 sccm<br>SiH$_4$: 10-50 sccm | 10-100 | 1-10 |
| | Fourth amorphous layer 16b | 150-250 | H$_2$: 0-300 sccm<br>SiH$_4$: 10-50 sccm<br>PH$_3$/H$_2$: 10-50 sccm | 10-100 | 1-10 |

The substrate 10 includes crystalline semiconductor material. The substrate 10 may be a crystalline semiconductor substrate of n-type or p-type conductivity. The substrate 10 may use, for example, a monocrystalline silicon substrate, a polycrystalline silicon substrate, a gallium arsenide substrate (GaAs), an indium phosphide substrate (InP), or the like. The substrate 10 absorbs incident light to generate carrier pairs of electrons and holes through photoelectric conversion. A description is given below of an example in which an n-type silicon monocrystalline substrate is used as the substrate 10.

The substrate 10 is placed in a film formation chamber after being cleaned. The cleaning of the substrate 10 can be performed using a hydrofluoric acid (HF water solution) or an RCA cleaning solution. Alternatively, a texture structure may be preferably formed on a front surface or back surface of the substrate 10 using an alkaline etchant such as a potassium hydroxide water solution (KOH water solution).

Next, the front surface of the substrate 10 is subjected to a surface treatment. Here, the front surface of the substrate 10 is one of main surfaces of the substrate 10 and the back surface of the substrate 10 is a surface of the substrate 10 on the side opposite the front surface.

As shown in Table 1, the surface treatment is performed by introducing a p-type dopant-containing gas and an oxygen-containing gas at the same time in a hydrogen plasma treatment. As the p-type dopant-containing gas, diborane (B$_2$H$_6$) is used, for example. As the oxygen-containing gas, carbon dioxide (CO$_2$) is used, for example. This allows boron (B) and oxygen (O) to be introduced into an interface between the substrate 10 and the first amorphous layer 12a.

The first amorphous layer 12a serving as an amorphous semiconductor layer is formed on the front surface of the substrate 10 having been subjected to the surface treatment in this way. For example, the first amorphous layer 12a may be an amorphous silicon layer including hydrogen. The first amorphous layer 12a is preferably made thin so as to inhibit light absorption as much as possible while being made thick enough to passivate the front surface of the substrate 10. A film thickness of the first amorphous layer 12a is equal to or greater than 1 nm and equal to or less than 25 nm, and preferably equal to or greater than 5 nm and equal to or less than 10 nm.

The first amorphous layer 12a can be formed through PECVD (Plasma Enhanced Chemical Vapor Deposition), Cat-CVD (Catalytic Chemical Vapor Deposition), sputtering, or the like. For PECVD, any of RF plasma CVD, VHF plasma CVD employing a high frequency, microwave plasma CVD, or the like may be used. In the embodiment, a description is given of the case of using the RF plasma CVD.

For example, as shown in Table 1, the first amorphous layer 12a can be formed by supplying a silicon-containing gas such as silane (SiH$_4$) and hydrogen as a diluent gas, which is turned into plasma by applying RF high-frequency electric power to a parallel-plate electrode or the like, to a film formation surface of the semiconductor substrate 10 which is heated. A substrate temperature during the film formation is equal to or greater than 150° C. and equal to or less than 250° C., and an RF power density is equal to or greater than 1 mW/cm$^2$ and equal to or less than 10 mW/cm$^2$.

Figure 2:
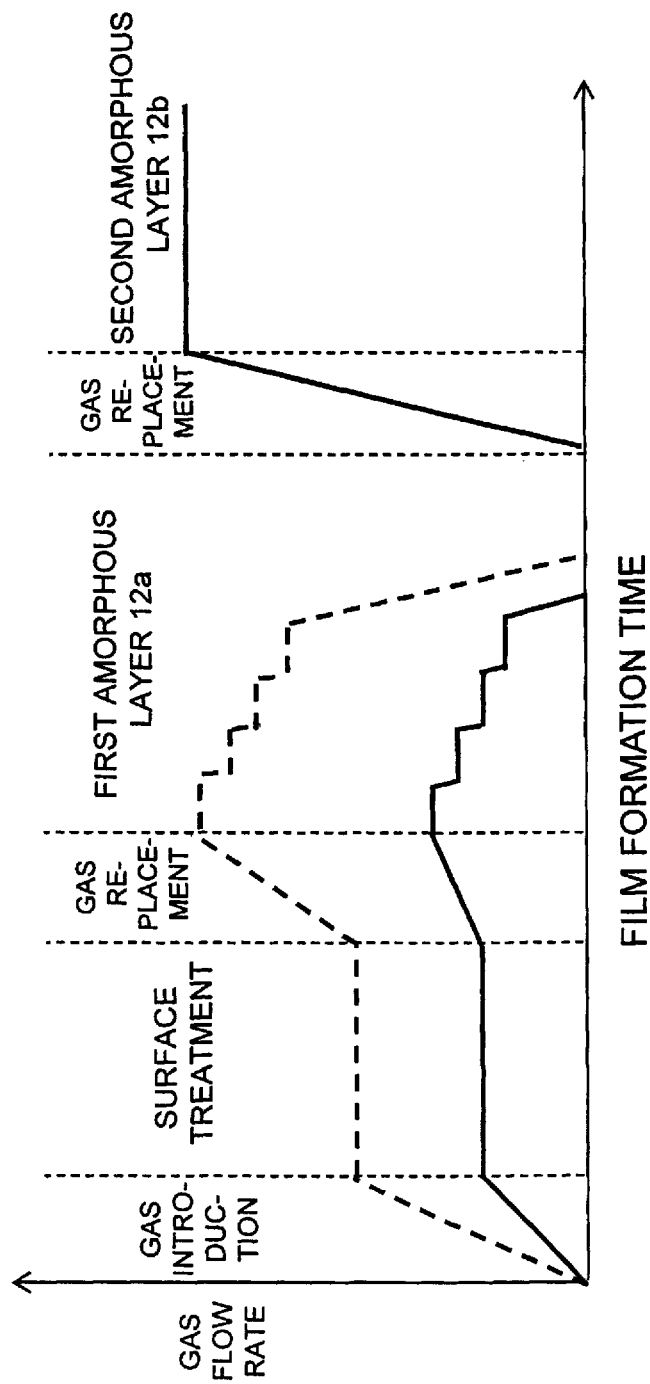
FIG. 2 is a time chart of gas introduction in a film formation process for the photovoltaic device in the embodiment.

As shown in a time chart in FIG. 2, at an initial stage of the formation of the first amorphous layer 12a, the p-type dopant-containing gas such as diborane (B$_2$H$_6$) or the like and the oxygen-containing gas such as carbon dioxide (CO$_2$) or the like are added to start the film formation.

At this time, as shown in FIG. 2 with a solid line, an amount of the p-type dopant-containing gas to be supplied is decreased stepwise. In FIG. 2, the supply of the p-type dopant-containing gas is decreased across four steps, but the invention is not limited thereto, and preferably is decreased stepwise at least one time. At this time, the p-type dopant contained in the first amorphous layer 12a preferably has a maximum density in the vicinity of the interface of equal to or greater than $1 \times 10^{18}$/cm$^3$ and less than $5 \times 10^{19}$/cm$^3$, has a density, which is decreased stepwise from this, of equal to or greater than $5 \times 10^{17}$/cm$^3$ and less than $5 \times 10^{18}$/cm$^3$, and has a bottom density of equal to or greater than $1 \times 10^{17}$/cm$^3$ and less than $2 \times 10^{18}$/cm$^3$.

As shown in FIG. 2 with a broken line, an amount of the oxygen-containing gas to be supplied may be changed stepwise. The supply amount of the oxygen-containing gas is also preferably decreased stepwise at least one time. Particularly, the decrease is preferably performed at the same timing as that of the supply amount of the p-type dopant-containing gas. At this time, the oxygen contained in the first amorphous layer 12a preferably has a maximum density in the vicinity of the interface of equal to or greater than $1 \times 10^{21}$/cm$^3$ and more preferably equal to or greater than ten times and less than 1000 times the p-type dopant density, has a density, which is decreased stepwise from this, of equal to or greater than $1 \times 10^{17}$/cm$^3$ and less than $1 \times 10^{21}$/cm$^3$, and has a bottom density of less than $5 \times 10^{20}$/cm$^3$.

The second amorphous layer 12b is a layer including an amorphous semiconductor film having a dopant of p-type conductivity. For example, the second amorphous layer 12b may be an amorphous silicon layer including hydrogen. The second amorphous layer 12b has the p-type dopant density in the film higher than that in the first amorphous layer 12a. For example, the second amorphous layer 12b preferably has a p-type dopant density equal to or greater than $1 \times 10^{20}$/cm$^3$. A film thickness of the second amorphous layer 12b is preferably made thin so as to inhibit light absorption as much as possible while being made thick enough to effectively separate carriers generated in the substrate 10 at the pn junction as well as to efficiently collect the generated carriers in the transparent conductive layer 14. For example, the thickness is preferably equal to or greater than 1 nm and equal to or less than 10 nm.

The second amorphous layer 12b can be formed through PECVD, Cat-CVD, sputtering or the like. For PECVD, RF plasma CVD may be used. For example, as shown in Table 1, the second amorphous layer 12b can be formed by supplying the silicon-containing gas such as silane ($SiH_4$) added with the p-type dopant-containing gas such as diborane ($B_2H_6$) which are diluted by hydrogen, which is turned into plasma by applying RF high-frequency electric power to a parallel-plate electrode or the like, onto the first amorphous layer 12a which is heated. A substrate temperature during the film formation is equal to or greater than 150° C. and equal to or less than 250° C., and an RF power density is equal to or greater than 1 $mW/cm^2$ and equal to or less than 10 $mW/cm^2$.

Next, the back surface of the substrate 10 is subjected to a surface treatment. The surface treatment on the back surface is a hydrogen plasma treatment without introducing the p-type dopant-containing gas and the oxygen-containing gas.

The third amorphous layer 16a is formed on the back surface of the substrate 10 having been subjected to the surface treatment. For example, the third amorphous layer 16a may be an amorphous silicon layer including hydrogen. A density of the p-type or n-type dopant contained in the third amorphous layer 16a is preferably less than $1\times10^{18}/cm^3$. Alternatively, if the p-type and n-type dopants are contained at the same time, a semiconductor layer having a difference in p-type or n-type dopant density of less than $1\times10^{18}/cm^3$ is used. A film thickness of the third amorphous layer 16a is equal to or greater than 1 nm and equal to or less than 25 nm, preferably equal to or greater than 5 nm and equal to or less than 10 nm, similar to the first amorphous layer 12a.

The third amorphous layer 16a can be formed through PECVD, Cat-CVD, sputtering, or the like. For PECVD, RF plasma CVD may be used.

For example, as shown in Table 1, a third amorphous layer 16a can be formed by supplying the silicon-containing gas such as silane ($SiH_4$) diluted by hydrogen, which is turned into plasma by applying RF high-frequency electric power to a parallel-plate electrode or the like, to the film formation surface of the substrate 10 which is heated. A substrate temperature during the film formation is equal to or greater than 150° C. and equal to or less than 250° C., and an RF power density is equal to or more than 1 $mW/cm^2$ and equal to or less than 10 $mW/cm^2$, similar to the first amorphous layer 12a.

The fourth amorphous layer 16b is a layer including amorphous semiconductor film having a dopant of n-type conductivity. For example, the fourth amorphous layer 16b is an amorphous silicon layer including hydrogen. The fourth amorphous layer 16b has an n-type dopant density in the film higher than that in the third amorphous layer 16a. For example, the fourth amorphous layer 16b preferably has an n-type dopant density of equal to or greater than $1\times10^{20}/cm^2$. A film thickness of the fourth amorphous layer 16b is preferably made thin so as to inhibit light absorption as much as possible while being made thick enough to effectively separate carriers generated in the substrate 10 by way of a BSF (Back Surface Field) structure as well as to efficiently collect the generated carriers in the transparent conductive layer 18. For example, the thickness is preferably equal to or greater than 1 nm and equal to or less than 10 nm.

The fourth amorphous layer 16b can be also formed through PECVD, Cat-CVD, sputtering, or the like. For PECVD, RF plasma CVD may be used.

For example, as shown in Table 1, the fourth amorphous layer 16b can be formed by supplying the silicon-containing gas such as silane ($SiH_4$) and the n-type dopant-containing gas such as phosphine ($PH_3$) diluted by hydrogen, which are turned into plasma by applying RF high-frequency electric power to a parallel-plate electrode or the like, onto the third amorphous layer 16a of the substrate 10 which is heated. A substrate temperature during the film formation is preferably equal to or greater than 150° C. and equal to or less than 250° C., and an RF power density is preferably equal to or greater than 1 $mW/cm^2$ and equal to or less than 10 $mW/cm^2$.

It is arbitrary choice whether to set the front surface side or to set the back surface side of the substrate 10 as a light-receiving surface (a surface through which the light is mainly introduced from the outside). In addition, in the above-described embodiment, after the first amorphous layer 12a and the second amorphous layer 12b are formed on the front surface side, the third amorphous layer 16a and fourth amorphous layer 16b are formed on the back surface side, but the order of formation of these layers is also arbitrary.

The transparent conductive layers 14 and 18 are formed over the second amorphous layer 12b and the fourth amorphous layer 16b, respectively. The transparent conductive layers 14 and 18 are formed, for example, to include at least one of metal oxides having a polycrystalline structure, such as indium oxide ($In_2O_3$), zinc oxide (ZnO), tin oxide ($SnO_2$), or titanium oxide ($TiO_2$), and the metal oxide may be doped with a dopant such as tin (Sn), zinc (Zn), tungsten (W), antimony (Sb), titanium (Ti), cerium (Ce), or gallium (Ga). The transparent conductive layers 14 and 18 may be formed through a thin film formation method such as deposition, plasma-enhanced chemical vapor deposition (PECVD), or sputtering. Film thicknesses of the transparent conductive layers 14 and 18 can be suitably adjusted according to the indices of refraction of the transparent conductive layers 14 and 18, and in the embodiment, the thicknesses are equal to or greater than 70 nm and equal to or less than 100 nm.

The first electrode 20 and the second electrode 22 are formed over the transparent conductive layers 14 and 18, respectively. The first electrode 20 and the second electrode 22 preferably have a comb-shaped finger electrode structure. The first electrode 20 and the second electrode 22 can be formed through screen printing, coating, or the like. The first electrode 20 and the second electrode 22 are formed, for example, by applying a silver paste or the like with a thickness of several tens of μm.

Figure 3:
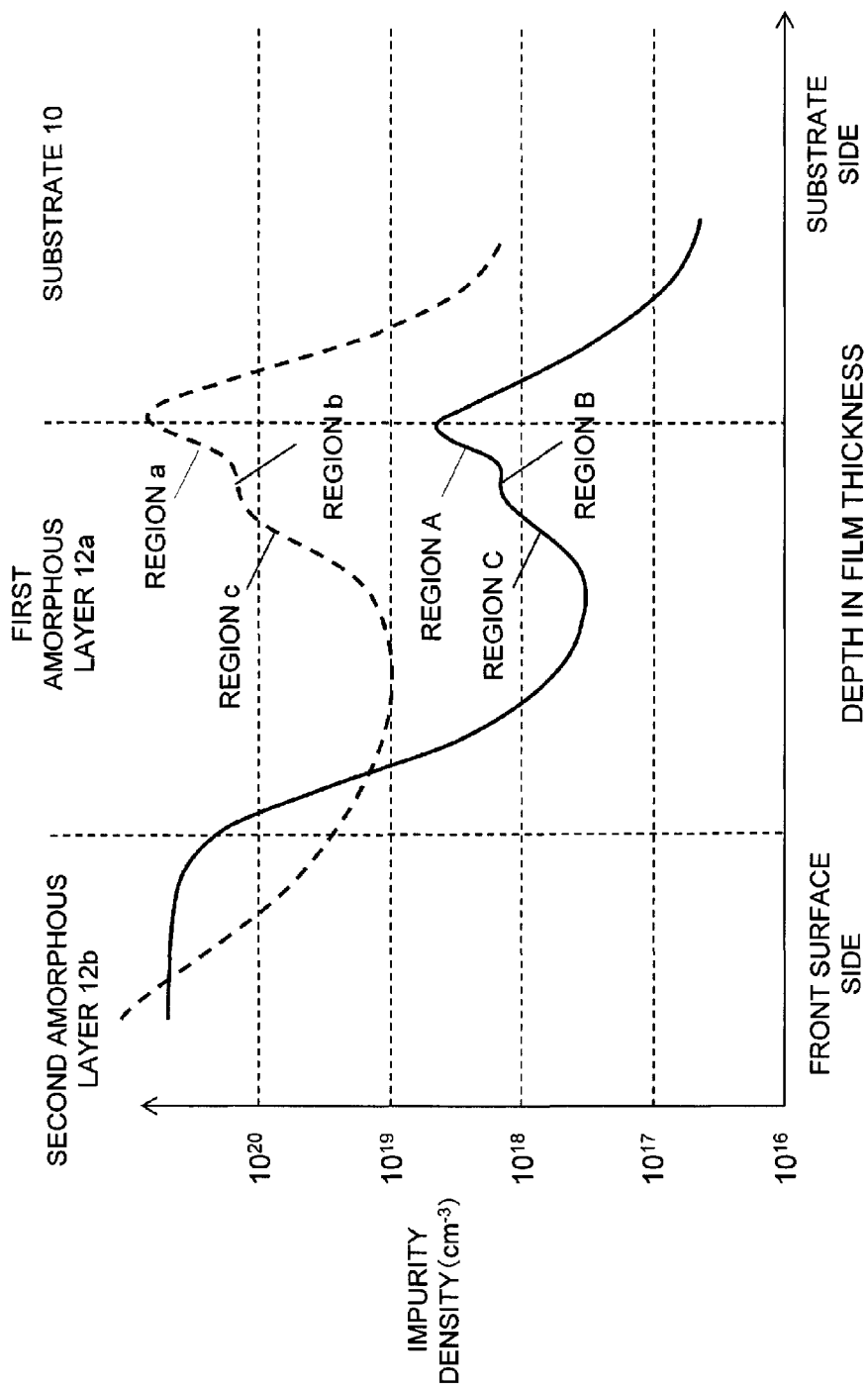
FIG. 3 is a diagram illustrating profiles of a p-type dopant density and an oxygen density in a film thickness direction of the photovoltaic device in the embodiment.

FIG. 3 shows density profiles of boron (B) and oxygen (O) in a depth direction from the second amorphous layer 12b and the first amorphous layer 12a toward the substrate 10.

As shown in FIG. 3 with a solid line, the boron density profile decreases stepwise toward the film thickness direction of the first amorphous layer 12a from the vicinity of the interface between the substrate 10 and the first amorphous layer 12a. Specifically, in a high density boron region within a range of 2 nm from the interface between the substrate 10 and the first amorphous layer 12a, the boron density is equal to or greater than $1\times10^{18}/cm^3$ and equal to or less than $5\times10^{19}/cm^3$. The profile has a region A with rapid decrease toward the first amorphous layer 12a side, a region B with temporal moderate decrease, and a region C with rapid decrease again. In other words, the boron density profile is stepwise in the film thickness direction with the region B defining a boundary. Here, a range of a film thickness of the region B is preferably equal to or greater than 2 nm and equal to or less than 5 nm. The boron density of the region B is preferably equal to or greater than $5 \times 10^{17}/cm^3$ and less than $5 \times 10^{18}/cm^3$.

A description is given of factors causing the boron density profile. In the region A, supplying diborane ($B_2H_6$) in the surface treatment step before starting the formation of the first amorphous layer 12a becomes a factor. In the region B, supplying diborane ($B_2H_6$) in the surface treatment step and supplying diborane ($B_2H_6$) in a stepwise decreasing manner during the formation of the first amorphous layer 12a become a factor. In the region C, supplying diborane ($B_2H_6$) in a stepwise decreasing manner during the formation of the first amorphous layer 12a becomes a factor.

In a case where the supply amount of the oxygen-containing gas is changed stepwise during the formation of the first amorphous layer 12a, as shown in FIG. 3 with a broken line, the oxygen density profile decreases stepwise toward the film thickness direction of the first amorphous layer 12a from the vicinity of the interface between the substrate 10 and the first amorphous layer 12a. Specifically, in a high density oxygen region within a range of 2 nm from the interface between the substrate 10 and the first amorphous layer 12a, the oxygen density is equal to or greater than ten times and equal to or less than 1000 times the boron density. The profile has a region a with rapid decrease toward the first amorphous layer 12a side, a region b with temporal moderate decrease, and a region c with rapid decrease again. In other words, the oxygen density profile is stepwise in the film thickness direction with the region b defining a boundary.

Here, the density profiles of boron and oxygen in the film thickness direction may have at least one stepwise change region, and further may have two or more stepwise change regions.

The densities of the respective elements in the semiconductor film can be measured through secondary ion mass spectrometry (SIMS) or the like. If the substrate 10 is provided with a texture structure, the densities of the elements in the film may be measured by a method in which the resolution in the film thickness direction is not reduced by the texture.

EXAMPLES AND COMPARATIVE EXAMPLES

A photovoltaic device formed through the above-described formation method and under the conditions shown in Table 2 is used as Example, the device including the first amorphous layer 12a which has a boron density profile decreasing stepwise toward the film thickness direction from the interface with the substrate 10. In other words, the boron density profile has a peak of boron density existing in the interface between the substrate 10 and the first amorphous layer 12a, has a boron density in the first amorphous layer 12a lower than that in the interface, and has one region existing in the vicinity of the interface where the density decreases stepwise in the film thickness direction.

TABLE 2

| | First amorphous silicon layer | |
| --- | --- | --- |
| | $SiH_4:B_2H_6:CO_2$ Flow ratio | Density profile characteristics of boron and oxygen (Estimated through SIMS) |
| Example 1 | Region B 100:2.5 × 10$^{-7}$:0<br>Region C 100:0:0 | Boron density profile decreasing stepwise from substrate front surface with region B having boron density of $5 \times 10^{17}/cm^3$ |
| Example 2 | Region B 100:2.5 × 10$^{-6}$:0<br>Region C 100:0:0 | Boron density profile decreasing stepwise from substrate front surface with region B having boron density of $5 \times 10^{18}/cm^3$ |
| Example 3 | Region B 100:1 × 10$^{-5}$:0<br>Region C 100:0:0 | Boron density profile decreasing stepwise from substrate front surface with region B having boron density of $2 \times 10^{19}/cm^3$ |
| Example 4 | Region B 100:2.5 × 10$^{-6}$:5<br>Region C 100:0:5 | Boron density profile decreasing stepwise from substrate front surface with region B having boron density of $5 \times 10^{18}/cm^3$ and with entire first amorphous silicon layer having approximately constant oxygen density of about $2 \times 10^{20}/cm^3$ |
| Example 5 | Region B 100:2.5 × 10$^{-6}$:5<br>Region C 100:0:0 | Boron and oxygen density profiles decreasing stepwise from substrate front surface with region B having boron density of $5 \times 10^{18}/cm^3$ and oxygen density of $2 \times 10^{20}/cm^3$ |
| [Comparative Example 1] | Regions, B, C 100:0:0 | Boron density profile decreasing from substrate front surface with no stepwise shaped portion |
| [Comparative Example 2] | Regions, B, C 100:2.5 × 10$^{-6}$:0 | Boron density profile decreasing from substrate front surface with no stepwise shaped portion and with entire first amorphous layer having approximately constant boron density of about $5 \times 10^{18}/cm^3$ |
| [Comparative Example 3] | Regions, B, C 100:2.5 × 10$^{-5}$:0 | Entire first amorphous layer having approximately constant boron density of about $4 \times 10^{19}/cm^3$ |

In the following description, the density profile is a measurement result under the conditions of no texture, no transparent conductive layers 14 and 18, no first electrode 20, and no second electrode.

In Example 1, in the surface treatment on the substrate 10 before the formation of the first amorphous layer 12a, a flow ratio between hydrogen and diborane ($B_2H_6$) was set to $1:1\times10^{-5}$ and a treatment time of three minutes was provided. After that, a flow ratio between silane ($SiH_4$), diborane ($B_2H_6$), and carbon dioxide was set to $100:2.5\times10^{-7}:0$, and an initial layer of the first amorphous layer 12a was formed to a thickness of 2 to 5 nm. After that, the flow ratio between silane ($SiH_4$), diborane ($B_2H_6$), and carbon dioxide was set to 100:0:0, and the first amorphous layer 12a was formed. The boron density in the first amorphous layer 12a formed as above was measured through SIMS to obtain a maximum density of $4\times10^{19}/cm^3$ in the vicinity of the interface between the substrate 10 and the first amorphous layer 12a (region A in FIG. 3) and a density of $5\times10^{17}/cm^3$ at a stepwise portion (region B in FIG. 3).

In Example 2, after the surface treatment was performed under the same conditions as in Example 1, the flow ratio between silane ($SiH_4$), diborane ($B_2H_6$), and carbon dioxide was to set to $100:2.5\times10^{-6}:0$, and an initial layer of the first amorphous layer 12a was formed to a thickness of 2 to 5 nm. After that, the flow ratio between silane ($SiH_4$), diborane ($B_2H_6$), and carbon dioxide was set to 100:0:0, and the formation of the first amorphous layer 12a was continued. The boron density in the first amorphous layer 12a formed as above was measured through SIMS to obtain a maximum density of $4\times10^{19}/cm^3$ in the vicinity of the interface between the substrate 10 and the first amorphous layer 12a (region A in FIG. 3) similar to Example 1 and a density of $5\times10^{18}/cm^3$ at the stepwise portion (region B in FIG. 3).

In Example 3, after the surface treatment was performed under the same conditions as in Example 1, the flow ratio between silane ($SiH_4$), diborane ($B_2H_6$), and carbon dioxide was to set to $100:1\times10^{-5}:0$, and an initial layer of the first amorphous layer 12a was formed to a thickness of 2 to 5 nm. After that, the flow ratio between silane ($SiH_4$), diborane ($B_2H_6$), and carbon dioxide was to set to 100:0:0, and the formation of the first amorphous layer 12a was continued. The boron density in the first amorphous layer 12a formed as above was measured through SIMS to obtain a maximum density of $4\times10^{19}/cm^3$ in the vicinity of the interface between the substrate 10 and the first amorphous layer 12a (region A in FIG. 3) similar to Example 1 and a density of $2\times10^{19}/cm^3$ at the stepwise portion (region B in FIG. 3).

In Example 4, after the surface treatment was performed under the same conditions as in Example 1, the flow ratio between silane ($SiH_4$), diborane ($B_2H_6$), and carbon dioxide was to set to $100:2.5\times10^{-6}:5$, and an initial layer of the first amorphous layer 12a was formed to a thickness of 2 to 5 nm. After that, the flow ratio between silane ($SiH_4$), diborane ($B_2H_6$), and carbon dioxide was to set to 100:0:5, and the formation of the first amorphous layer 12a was continued. The boron density in the first amorphous layer 12a formed as above was measured through SIMS to obtain the maximum density of $4\times10^{19}/cm^3$ in the vicinity of the interface between the substrate 10 and the first amorphous layer 12a (region A in FIG. 3) similar to Example 1 and a density of $5\times10^{18}/cm^3$ at the stepwise portion (region B in FIG. 3). Further, in Example 4, the oxygen density was $2\times10^{20}/cm^3$ all over the first amorphous layer 12a.

In Example 5, after the surface treatment was performed under the same conditions as in Example 1, the flow ratio between silane ($SiH_4$), diborane ($B_2H_6$), and carbon dioxide was to set to $100:2.5\times10^{-6}:5$, and an initial layer of the first amorphous layer 12a was formed to a thickness of 2 to 5 nm. After that, the flow ratio between silane ($SiH_4$), diborane ($B_2H_6$), and carbon dioxide was to set to 100:0:0, and the formation of the first amorphous layer 12a was continued. The boron density in the first amorphous layer 12a formed as above was measured through SIMS to obtain a maximum density of $4\times10^{19}/cm^3$ in the vicinity of the interface between the substrate 10 and the first amorphous layer 12a (region A in FIG. 3) similar to Example 1 and a density of $5\times10^{18}/cm^3$ at the stepwise portion (region B in FIG. 3). Further, in Example 5, the oxygen density was $2\times10^{20}/cm^3$ in the vicinity of the interface between the substrate 10 and the first amorphous layer 12a.

In Comparative Example 1, after the surface treatment was performed under the same conditions as in Example 1, the flow ratio between silane ($SiH_4$), diborane, ($B_2H_6$) and carbon dioxide was to set to 100:0:0, and an initial layer of the first amorphous layer 12a was formed to a thickness of 2 to 5 nm. After that, the flow ratio between silane ($SiH_4$), diborane ($B_2H_6$), and carbon dioxide was to set to 100:0:0, and the formation of the first amorphous layer 12a was continued. The boron density in the first amorphous layer 12a formed as above was measured through SIMS to obtain a boron density monotonically decreasing from the vicinity of the interface between the substrate 10 and the first amorphous layer 12a with the profile having no stepwise portion.

In Comparative Example 2, after the surface treatment was performed under the same conditions as in Example 1, the flow ratio between silane ($SiH_4$), diborane ($B_2H_6$), and carbon dioxide was to set to $100:2.5\times10^{-6}:0$, and an initial layer of the first amorphous layer 12a was formed to a thickness of 2 to 5 nm. After that, the flow ratio between silane ($SiH_4$), diborane ($B_2H_6$), and carbon dioxide was to set to $100:2.5\times10^{-6}:0$, and the formation of the first amorphous layer 12a was continued. The boron density in the first amorphous layer 12a formed as above was measured through SIMS to obtain a boron density of $5\times10^{18}/cm^3$ in almost the entire first amorphous layer 12a except for the vicinity of the interface between the substrate 10 and the first amorphous layer 12a.

In Comparative Example 3, after the surface treatment was performed under the same conditions as in Example 1, the flow ratio between silane ($SiH_4$), diborane ($B_2H_6$), and carbon dioxide was to set to $100:2.5\times10^{-5}:0$, and an initial layer of the first amorphous layer 12a was formed to a thickness of 2 to 5 nm. After that, the flow ratio between silane ($SiH_4$), diborane ($B_2H_6$), and carbon dioxide was to set to $100:2.5\times10^{-5}:0$, and the formation of the first amorphous layer 12a was continued. The boron density in the first amorphous layer 12a formed as above was measured through SIMS to obtain a boron density of $4\times10^{19}/cm^3$ in almost the entire first amorphous layer 12a including the vicinity of the interface between the substrate 10 and the first amorphous layer 12a.

Table 3 shows output characteristics of the photovoltaic devices in Examples and Comparative Examples. Measured data pieces were open-circuit voltages (Voc), short-circuit currents (Isc), fill factors (FF), and output powers (Pmax). In Table 2, normalized values which were normalized against the values in Comparative Example 1 as 1 are shown.

TABLE 3

Normalized photovoltaic cell characteristics

| | Open-circuit voltage Voc | Short-circuit current Isc | Fill factor F.F. | Output power Pmax |
|---|---|---|---|---|
| Example 1 | 0.999 | 1.000 | 1.014 | 1.013 |
| Example 2 | 0.998 | 1.000 | 1.018 | 1.016 |
| Example 3 | 0.996 | 1.000 | 1.008 | 1.002 |
| Example 4 | 1.008 | 1.000 | 1.007 | 1.015 |
| Example 5 | 1.008 | 1.000 | 1.013 | 1.021 |
| [Comparative Example 1] | 1.000 | 1.000 | 1.000 | 1.000 |
| [Comparative Example 2] | 0.985 | 0.999 | 0.990 | 0.974 |
| [Comparative Example 3] | 0.955 | 0.998 | 0.985 | 0.938 |

The measurement result is a result of measurement after the texture, the transparent conductive layers 14 and 18, the first electrode 20, and the second electrode were formed to obtain a device structure.

In comparison to Comparative Examples 1 to 3, in Examples 1 to 5, improvement in the fill factor (FF) and the output power (Pmax) can be confirmed. A common point of difference between Comparative Examples 1 to 3 and Examples 1 to 5 is that a distribution of the boron density in the first amorphous layer 12a has the stepwise portion (region B in FIG. 3). This confirms that when the boron density distribution in the first amorphous layer 12a is provided with the stepwise portion (region B in FIG. 3), photoelectric conversion efficiency is increased in the photovoltaic device.

In comparison to Comparative Examples 1 to 3 and Examples 1 to 3, in Examples 4 to 5, improvement in the open-circuit voltage (Voc) can be confirmed. A common point of difference between Comparative Examples 1 to 3 and Examples 1 to 3, and Examples 4 to 5 is that a distribution of the oxygen density in the first amorphous layer 12a also has the stepwise portion (region B in FIG. 3). This confirms that when the oxygen density distribution in the first amorphous layer 12a is also provided with the stepwise portion (region B in FIG. 3) as well as the boron density distribution is provided with the stepwise portion, the photoelectric conversion efficiency is further increased in the photovoltaic device.

In Comparative Examples 1 to 3 in which the boron density distribution in the first amorphous layer 12a is not provided with the stepwise portion, it can be considered that disorder in the structure is comparatively large in the vicinity of the interface between the substrate 10 and the first amorphous layer 12a to decrease electrical conductive property. On the other hand, it is estimated that, as in Examples 1 to 5, if high-density boron is introduced into the interface between the substrate 10 and the first amorphous layer 12a such that the boron density profile has the boron density decreasing stepwise in the film thickness direction, the electrical conductive property of the first amorphous layer 12a may be increased and power generation efficiency may be increased.

A growth initial layer of the first amorphous layer 12a has large disorder in the structure, from which it is estimated that the electrical conductivity decreases. On the other hand, boron, when introduced, functions as an acceptor to have an effect of improving electrical conductivity, but the recombination center is to be increased. It can be considered that the density profile having the boron density decreasing stepwise as in the embodiment allows improvement of the electrical conductivity while suppressing an increase in the recombination center to thereby allow enhancement of the power generation efficiency.

The boron density decreasing stepwise from the vicinity of the interface is controlled to fall within a range equal to or greater than $5 \times 10^{17}/cm^3$ and less than $5 \times 10^{18}/cm^3$ so that the power generation efficiency can be more effectively improved.

High-density oxygen introduction into the interface between the substrate 10 and the first amorphous layer 12a can further improve the power generation efficiency. This can be estimated because the oxygen introduction into the interface between the substrate 10 and the first amorphous layer 12a inactivates defects generated due to boron addition. On the other hand, as the high-density oxygen density increases, a resistance value of the first amorphous layer 12a increases. Therefore, it can be estimated that the oxygen density in the high-density oxygen region is made equal to or greater than ten times and less than 1000 times of the boron density such that improvement in the electrical conductive property is allowed while suppressing the defects generation to thereby allow improvement of the power generation efficiency. In the case of the stepwise boron density profile, if the oxygen density increases in a region having low boron density, a resistance increase rate increases, and therefore, the oxygen density profile is preferably stepwise along with the boron density profile.

The invention claimed is:

1. A photovoltaic device comprising:
   a crystalline semiconductor substrate; and
   an amorphous semiconductor layer formed directly on a main surface of the substrate, wherein
   the amorphous semiconductor layer has a portion having a p-type dopant density profile decreasing stepwise in a film thickness direction from the vicinity of an interface between the substrate and the amorphous semiconductor layer,
   the p-type dopant density profile comprising:
   a top portion having a maximum density in the vicinity of the interface,
   a bottom portion having a minimum density at a location father from the interface
   than the top portion is from the interface, and
   two inflection points between the top portion and the bottom portion;
   wherein the amorphous semiconductor layer has a thickness less than or equal to 35 nm; and
   the portion having the p-type dopant density profile has a thickness of 25 nm or less.

2. The photovoltaic device according to claim 1, wherein the p-type dopant density within a range of 2 nm from the vicinity of the interface between the substrate and the amorphous semiconductor layer is equal to or greater than $1 \times 10^{18}/cm^3$ and equal to or less than $5 \times 10^{19}/cm^3$.

3. The photovoltaic device according to claim 1, wherein an oxygen density within a range of 2 nm from the vicinity of the interface between the substrate and the amorphous semiconductor layer is equal to or greater than $1 \times 10^{19}/cm^3$.

4. The photovoltaic device according to claim 1, wherein the amorphous semiconductor layer has an oxygen density profile decreasing stepwise in the film thickness direction from the vicinity of the interface between the substrate and the amorphous semiconductor layer.

5. The photovoltaic device according to claim 3, wherein an oxygen density within a range of 2 nm from the vicinity of the interface between the substrate and the amorphous semiconductor layer is equal to or greater than ten times and less than 1000 times the p-type dopant density.

6. The photovoltaic device according to claim 1, wherein a range of a film thickness at the stepwise portion of the p-type dopant density profile is equal to or greater than 2 nm and equal to or less than 5 nm.

7. The photovoltaic device according to claim 1, wherein the p-type dopant density at the stepwise portion of the p-type dopant density profile is equal to or greater than $5 \times 10^{17}/cm^3$ and less than $5 \times 10^{18}/cm^3$.

* * * * *